(12) United States Patent
Chen et al.

(10) Patent No.: US 12,207,063 B2
(45) Date of Patent: Jan. 21, 2025

(54) AUTOMATIC AUDIO EQUALIZATION FOR ONLINE CONFERENCES

(71) Applicant: Zoom Video Communications, Inc., San Jose, CA (US)

(72) Inventors: Yuhui Chen, San Jose, CA (US); Zhaofeng Jia, Saratoga, CA (US)

(73) Assignee: Zoom Video Communications, Inc., San Jose, CA (US)

( * ) Notice: Subject to any disclaimer, the term of this patent is extended or adjusted under 35 U.S.C. 154(b) by 144 days.

(21) Appl. No.: 17/952,469

(22) Filed: Sep. 26, 2022

(65) Prior Publication Data
US 2024/0107230 A1 Mar. 28, 2024

(51) Int. Cl.
| | | |
|---|---|---|
| H04R 3/04 | (2006.01) | |
| G10L 21/0208 | (2013.01) | |
| H03G 5/16 | (2006.01) | |
| H04N 7/14 | (2006.01) | |
| H04N 7/15 | (2006.01) | |

(52) U.S. Cl.
CPC ............ *H04R 3/04* (2013.01); *G10L 21/0208* (2013.01); *H03G 5/165* (2013.01); *H04N 7/147* (2013.01); *H04N 7/15* (2013.01); *G10L 2021/02082* (2013.01)

(58) Field of Classification Search
CPC ........ H04R 3/04; H04R 29/001; H03G 5/025; H03G 5/165
USPC ................................. 381/98–99, 103, 58–59
See application file for complete search history.

(56) References Cited

U.S. PATENT DOCUMENTS

| | | | | |
|---|---|---|---|---|
| 8,918,197 | B2 * | 12/2014 | Suhami | H04M 3/569 |
| | | | | 704/271 |
| 9,960,743 | B2 * | 5/2018 | Seefeldt | H03G 9/24 |
| 10,355,658 | B1 * | 7/2019 | Yang | H03G 9/025 |
| 11,128,636 | B1 | 9/2021 | Jorasch et al. | |
| 11,190,873 | B2 * | 11/2021 | Son | H04R 29/004 |
| 11,269,426 | B2 | 3/2022 | Jorasch et al. | |
| 11,385,726 | B2 | 7/2022 | Jorasch et al. | |
| 11,955,939 | B2 * | 4/2024 | Fujino | H03G 3/3005 |
| 12,081,833 | B2 * | 9/2024 | Renner | G06N 3/04 |
| 2006/0034469 | A1 | 2/2006 | Tamiya et al. | |
| 2006/0093159 | A1 * | 5/2006 | Koh | H04R 3/04 |
| | | | | 381/74 |
| 2006/0140418 | A1 * | 6/2006 | Koh | H04R 25/70 |
| | | | | 381/98 |
| 2013/0108076 | A1 * | 5/2013 | Chu | H04N 7/147 |
| | | | | 381/98 |
| 2022/0006813 | A1 | 1/2022 | Jorasch et al. | |

* cited by examiner

*Primary Examiner* — Disler Paul
(74) *Attorney, Agent, or Firm* — Kilpatrick Townsend & Stockton LLP

(57) ABSTRACT

Example methods and systems provide automatic audio equalization for online conferences. A target, ideal, audio frequency response for use in online conferencing audio can be designed and preset for reference, and the equalizer can operate in real time to reach the target frequency response for any input. The equalizer can selectively apply per-band equalization to the audio signal as needed to adjust an energy value for each of multiple frequency bands to produce an output audio signal that that can be, as an example, routed through meeting servers or other infrastructure to other conference participants. The equalization can compensate for conditions local to a speaker that would otherwise adversely affect audio quality.

20 Claims, 8 Drawing Sheets

AUTOMATIC AUDIO EQUALIZATION FOR ONLINE CONFERENCES

FIELD

The present application relates to online audio and video conferencing systems, for example, those that make use of a client application connected through real or virtual servers. More specifically, the present application relates to audio processing to improve audio quality and intelligibility of participants in an online conference.

BRIEF DESCRIPTION OF THE DRAWINGS

The accompanying drawings, which are incorporated into and constitute a part of this specification, illustrate one or more certain examples and, together with the description of the example, serve to explain the principles and implementations of the certain examples.

DETAILED DESCRIPTION

Figure 1:
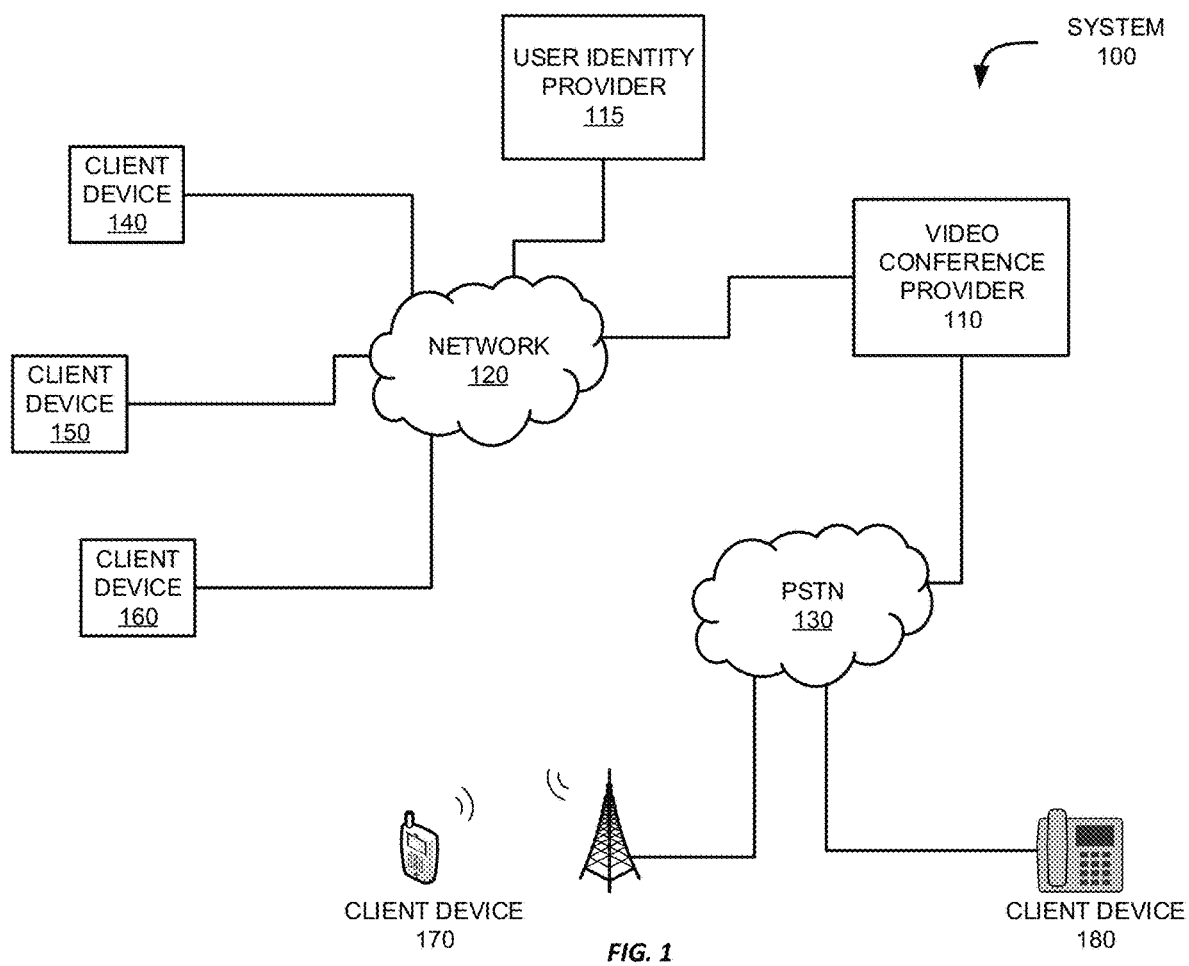
FIGS. 1-3 illustrate example systems to enable videoconferencing with automatic audio equalization as described herein.

Examples are described herein in the context of systems and methods for providing automatic audio equalization for online conferencing. Those of ordinary skill in the art will realize that the following description is illustrative only and is not intended to be in any way limiting. Reference will now be made in detail to implementations of examples as illustrated in the accompanying drawings. The same reference indicators will be used throughout the drawings and the following description to refer to the same or like items.

In the interest of clarity, not all of the routine features of the examples described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another.

Online conferencing systems enable their users to create and attend conferences (or "meetings") via various types of client devices. After joining a meeting, the participants receive audio and/or video streams or feeds (or "multimedia" streams or feeds) from the other participants and, in the case of a videoconference, are presented with views of the video feeds from one or more of the other participants and audio from the audio feeds. Using these different modalities, the participants can see and/or hear each other, engage more deeply, and generally have a richer experience despite not being physically in the same space.

In the case of videoconferencing systems, to create a meeting, a person (referred to as the "host" or "meeting host") accesses the videoconferencing system, schedules a new meeting, and identifies one or more other people to invite to the meeting. In response to the host creating the meeting, the videoconference system establishes the meeting by creating a meeting identifier and, if desired, a passcode or other access control information. The host can then send the meeting identifier (and access control information) to each of the invitees, such as by email. Once the meeting is started, the invitees can then access and join the meeting using the meeting identifier and any provided access control information. The initial, or main host can, in some systems, make another participant a co-host. For purposes of the discussion herein, the term "host" encompasses hosts and co-hosts. Hosts can manage and control the videoconferencing session.

To provide higher audio quality for users of modern digital telecommunication platforms and applications, a conferencing system according to this disclosure includes automatic audio equalization. A target ideal audio frequency response for use in online conferencing audio streams can be designed and preset for reference, and the equalizer can operate in real time to reach the target frequency response for any input. The preset response can be stored as specific ranges and limits, and the equalizer can access these values during operation. A smoothing technique can be used to avoid sharp changes in the perceived audio as the frequency response is being adjusted during an audio conference or videoconferencing meeting.

The equalization can be provided for an input audio signal, such as one originating from a microphone being used by a participant in a videoconference. An equalizer can selectively apply per-band equalization to the input audio signal as needed to adjust an energy value for each of multiple frequency bands to produce an output audio signal that is eventually routed through meeting servers or other infrastructure to other conference participants. The equalization can compensate for conditions local to a speaker that would otherwise adversely affect audio quality, conditions such as microphone location, microphone quality, background noise, and the presence of a face mask.

A system according to some examples can receive an input audio signal at a client device, for example, a computing device being used to participate in an online conference. The audio spectrum of at least a portion of the input audio signal is determined and the respective energy value for each of multiple frequency bands is determined. A difference between the energy value of each respective frequency band and a predetermined ideal band value associated with the frequency band is determined. Per-band equalization can then be selectively applied to the input audio signal to adjust the energy value for each frequency band to produce an output audio signal.

The equalization can be applied as part of an audio signal processing flow that includes one or more of acoustic echo cancelation, noise suppression, or automatic gain control. An equalizer module that provides the automatic equalization as described herein may be used in, as examples, an audio telecommunication device such as a digital telephone, a Web-based or installed videoconferencing application for desktop and notebook computers, or in an "app" (application) for deployment to smartphones or tablet computers.

The techniques disclosed herein for providing automatic audio equalization enables improved sound quality in audio and video conferences. By adding an equalization module to the audio signal processing, the intelligibility of speech can be improved. The equalization can be used with any type of microphone or sound device that a user is employing, since it adapts to each specific client device setup rather than being designed to work with known, standardized hardware. In can also be used with digital audio at various sampling rates.

This illustrative example is given to introduce the reader to the general subject matter discussed herein and the disclosure is not limited to this example. The following sections describe various additional non-limiting examples and examples of systems and methods for providing automatic audio equalization for online conferencing.

Referring now to FIG. 1, FIG. 1 shows an example system 100 that provides videoconferencing functionality to various client devices. The system 100 includes a video conference provider 110 that is connected to multiple communication networks 120, 130, through which various client devices 140-180 can participate in video conferences hosted by the video conference provider 110. For example, the video conference provider 110 can be located within a private network to provide video conferencing services to devices within the private network, or it can be connected to a public network, e.g., the internet, so it may be accessed by anyone. Some examples may even provide a hybrid model in which a video conference provider 110 may supply components to enable a private organization to host private internal video conferences or to connect its system to the video conference provider 110 over a public network.

The system optionally also includes one or more user identity providers, e.g., user identity provider 115, which can provide user identity services to users of the client devices 140-160 and may authenticate user identities of one or more users to the video conference provider 110. In this example, the user identity provider 115 is operated by a different entity than the video conference provider 110, though in some examples, they may be the same entity.

Figure 2:
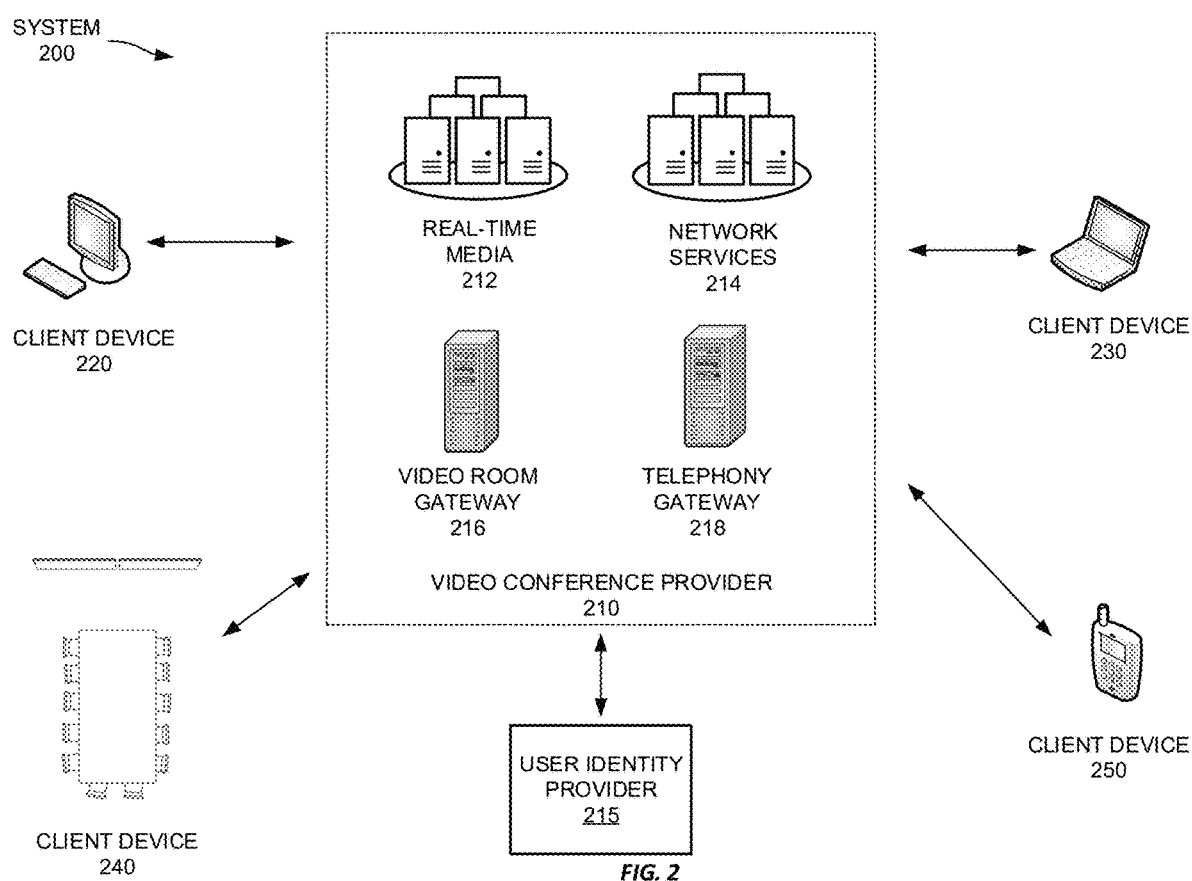

Video conference provider 110 allows clients to create videoconference meetings (or "meetings") and invite others to participate in those meetings as well as perform other related functionality, such as recording the meetings, generating transcripts from meeting audio, manage user functionality in the meetings, enable text messaging during the meetings, create and manage breakout rooms from the main meeting, etc. FIG. 2, described below, provides a more detailed description of the architecture and functionality of the video conference provider 110.

Meetings in this example video conference provider 110 are provided in virtual "rooms" to which participants are connected. The room in this context is a construct provided by a server that provides a common point at which the various video and audio data is received before being multiplexed and provided to the various participants. While a "room" is the label for this concept in this disclosure, any suitable functionality that enables multiple participants to participate in a common videoconference may be used. Further, in some examples, and as alluded to above, a meeting may also have "breakout" rooms. Such breakout rooms may also be rooms that are associated with a "main" videoconference room. Thus, participants in the main videoconference room may exit the room into a breakout room, e.g., to discuss a particular topic, before returning to the main room. The breakout rooms in this example are discrete meetings that are associated with the meeting in the main room. However, to join a breakout room, a participant must first enter the main room. A room may have any number of associated breakout rooms according to various examples.

To create a meeting with the video conference provider 110, a user may contact the video conference provider 110 using a client device 140-180 and select an option to create a new meeting. Such an option may be provided in a webpage accessed by a client device 140-160 or client application executed by a client device 140-160. For telephony devices, the user may be presented with an audio menu that they may navigate by pressing numeric buttons on their telephony device. To create the meeting, the video conference provider 110 may prompt the user for certain information, such as a date, time, and duration for the meeting, a number of participants, a type of encryption to use, whether the meeting is confidential or open to the public, etc. After receiving the various meeting settings, the video conference provider may create a record for the meeting and generate a meeting identifier and, in some examples, a corresponding meeting password or passcode (or other authentication information), all of which meeting information is provided to the meeting host.

After receiving the meeting information, the user may distribute the meeting information to one or more users to invite them to the meeting. To begin the meeting at the scheduled time (or immediately, if the meeting was set for an immediate start), the host provides the meeting identifier and, if applicable, corresponding authentication information (e.g., a password or passcode). The video conference system then initiates the meeting and may admit users to the meeting. Depending on the options set for the meeting, the users may be admitted immediately upon providing the appropriate meeting identifier (and authentication information, as appropriate), even if the host has not yet arrived, or the users may be presented with information indicating the that meeting has not yet started or the host may be required to specifically admit one or more of the users.

During the meeting, the participants may employ their client devices 140-180 to capture audio or video information and stream that information to the video conference provider 110. They also receive audio or video information from the video conference provider 210, which is displayed by the respective client device 140 to enable the various users to participate in the meeting.

At the end of the meeting, the host may select an option to terminate the meeting, or it may terminate automatically at a scheduled end time or after a predetermined duration. When the meeting terminates, the various participants are disconnected from the meeting, and they will no longer receive audio or video streams for the meeting (and will stop transmitting audio or video streams). The video conference provider 110 may also invalidate the meeting information, such as the meeting identifier or password/passcode.

To provide such functionality, one or more client devices 140-180 may communicate with the video conference provider 110 using one or more communication networks, such as network 120 or the public switched telephone network ("PSTN") 130. The client devices 140-180 may be any suitable computing or communications device that have audio or video capability. For example, client devices 140-160 may be conventional computing devices, such as desktop or laptop computers having processors and computer-readable media, connected to the video conference provider 110 using the internet or other suitable computer network. Suitable networks include the internet, any local area network ("LAN"), metro area network ("MAN"), wide area network ("WAN"), cellular network (e.g., 3G, 4G, 4G LTE, 5G, etc.), or any combination of these. Other types of computing devices may be used instead or as well, such as tablets, smartphones, and dedicated video conferencing equipment. Each of these devices may provide both audio and video capabilities and may enable one or more users to participate in a video conference meeting hosted by the video conference provider 110.

In addition to the computing devices discussed above, client devices 140-180 may also include one or more telephony devices, such as cellular telephones (e.g., cellular telephone 170), internet protocol ("IP") phones (e.g., telephone 180), or conventional telephones. Such telephony devices may allow a user to make conventional telephone calls to other telephony devices using the PSTN, including the video conference provider 110. It should be appreciated that certain computing devices may also provide telephony functionality and may operate as telephony devices. For example, smartphones typically provide cellular telephone capabilities and thus may operate as telephony devices in the example system 100 shown in FIG. 1. In addition, conventional computing devices may execute software to enable telephony functionality, which may allow the user to make and receive phone calls, e.g., using a headset and microphone. Such software may communicate with a PSTN gateway to route the call from a computer network to the PSTN. Thus, telephony devices encompass any devices that can make conventional telephone calls and is not limited solely to dedicated telephony devices like conventional telephones.

Referring again to client devices 140-160, these devices 140-160 contact the video conference provider 110 using network 120 and may provide information to the video conference provider 110 to access functionality provided by the video conference provider 110, such as access to create new meetings or join existing meetings. To do so, the client devices 140-160 may provide user identification information, meeting identifiers, meeting passwords or passcodes, etc. In examples that employ a user identity provider 115, a client device, e.g., client devices 140-160, may operate in conjunction with a user identity provider 115 to provide user identification information or other user information to the video conference provider 110.

A user identity provider 115 may be any entity trusted by the video conference provider 110 that can help identify a user to the video conference provider 110. For example, a trusted entity may be a server operated by a business or other organization and with whom the user has established their identity, such as an employer or trusted third-party. The user may sign into the user identity provider 115, such as by providing a username and password, to access their identity at the user identity provider 115. The identity, in this sense, is information established and maintained at the user identity provider 115 that can be used to identify a particular user, irrespective of the client device they may be using. An example of an identity may be an email account established at the user identity provider 115 by the user and secured by a password or additional security features, such as biometric authentication, two-factor authentication, etc. However, identities may be distinct from functionality such as email. For example, a health care provider may establish identities for its patients. And while such identities may have associated email accounts, the identity is distinct from those email accounts. Thus, a user's "identity" relates to a secure, verified set of information that is tied to a particular user and should be accessible only by that user. By accessing the identity, the associated user may then verify themselves to other computing devices or services, such as the video conference provider 110.

When the user accesses the video conference provider 110 using a client device, the video conference provider 110 communicates with the user identity provider 115 using information provided by the user to verify the user's identity. For example, the user may provide a username or cryptographic signature associated with a user identity provider 115. The user identity provider 115 then either confirms the user's identity or denies the request. Based on this response, the video conference provider 110 either provides or denies access to its services, respectively.

For telephony devices, e.g., client devices 170-180, the user may place a telephone call to the video conference provider 110 to access video conference services. After the call is answered, the user may provide information regarding a video conference meeting, e.g., a meeting identifier ("ID"), a passcode or password, etc., to allow the telephony device to join the meeting and participate using audio devices of the telephony device, e.g., microphone(s) and speaker(s), even if video capabilities are not provided by the telephony device.

Because telephony devices typically have more limited functionality than conventional computing devices, they may be unable to provide certain information to the video conference provider 110. For example, telephony devices may be unable to provide user identification information to identify the telephony device or the user to the video conference provider 110. Thus, the video conference provider 110 may provide more limited functionality to such telephony devices. For example, the user may be permitted to join a meeting after providing meeting information, e.g., a meeting identifier and passcode, but they may be identified only as an anonymous participant in the meeting. This may restrict their ability to interact with the meetings in some examples, such as by limiting their ability to speak in the meeting, hear or view certain content shared during the meeting, or access other meeting functionality, such as joining breakout rooms or engaging in text chat with other participants in the meeting.

It should be appreciated that users may choose to participate in meetings anonymously and decline to provide user identification information to the video conference provider 110, even in cases where the user has an authenticated identity and employs a client device capable of identifying the user to the video conference provider 110. The video conference provider 110 may determine whether to allow such anonymous users to use services provided by the video conference provider 110. Anonymous users, regardless of the reason for anonymity, may be restricted as discussed above with respect to users employing telephony devices, and in some cases may be prevented from accessing certain meetings or other services, or may be entirely prevented from accessing the video conference provider 110.

Referring again to video conference provider 110, in some examples, it may allow client devices 140-160 to encrypt their respective video and audio streams to help improve privacy in their meetings. Encryption may be provided between the client devices 140-160 and the video conference provider 110 or it may be provided in an end-to-end configuration where multimedia streams transmitted by the client devices 140-160 are not decrypted until they are received by another client device 140-160 participating in the meeting. Encryption may also be provided during only a portion of a communication, for example encryption may be used for otherwise unencrypted communications that cross international borders.

Client-to-server encryption may be used to secure the communications between the client devices 140-160 and the video conference provider 110, while allowing the video conference provider 110 to access the decrypted multimedia streams to perform certain processing, such as recording the meeting for the participants or generating transcripts of the meeting for the participants. End-to-end encryption may be used to keep the meeting entirely private to the participants without any worry about a video conference provider 110 having access to the substance of the meeting. Any suitable encryption methodology may be employed, including key-pair encryption of the streams. For example, to provide end-to-end encryption, the meeting host's client device may obtain public keys for each of the other client devices participating in the meeting and securely exchange a set of keys to encrypt and decrypt multimedia content transmitted during the meeting. Thus, the client devices 140-160 may securely communicate with each other during the meeting. Further, in some examples, certain types of encryption may be limited by the types of devices participating in the meeting. For example, telephony devices may lack the ability to encrypt and decrypt multimedia streams. Thus, while encrypting the multimedia streams may be desirable in many instances, it is not required as it may prevent some users from participating in a meeting.

By using the example system shown in FIG. 1, users can create and participate in meetings using their respective client devices 140-180 via the video conference provider 110. Further, such a system enables users to use a wide variety of different client devices 140-180 from traditional standards-based video conferencing hardware to dedicated video conferencing equipment to laptop or desktop computers to handheld devices to legacy telephony devices, etc.

Referring now to FIG. 2, FIG. 2 shows an example system 200 in which a video conference provider 210 provides videoconferencing functionality to various client devices 220-250. The client devices 220-250 include two conventional computing devices 220-230, dedicated equipment for a video conference room 240, and a telephony device 250. Each client device 220-250 communicates with the video conference provider 210 over a communications network, such as the internet for client devices 220-240 or the PSTN for client device 250, generally as described above with respect to FIG. 1. The video conference provider 210 is also in communication with one or more user identity providers 215, which can authenticate various users to the video conference provider 210 generally as described above with respect to FIG. 1.

In this example, the video conference provider 210 employs multiple different servers (or groups of servers) to provide different aspects of video conference functionality, thereby enabling the various client devices to create and participate in video conference meetings. The video conference provider 210 uses one or more real-time media servers 212, one or more network services servers 214, one or more video room gateway servers 216, and one or more telephony gateway servers 218. Each of these servers 212-218 is connected to one or more communications networks to enable them to collectively provide access to and participation in one or more video conference meetings to the client devices 220-250.

The real-time media servers 212 provide multiplexed multimedia streams to meeting participants, such as the client devices 220-250 shown in FIG. 2. While video and audio streams typically originate at the respective client devices, they are transmitted from the client devices 220-250 to the video conference provider 210 via one or more networks where they are received by the real-time media servers 212. The real-time media servers 212 determine which protocol is optimal based on, for example, proxy settings and the presence of firewalls, etc. For example, the client device might select among UDP, TCP, TLS, or HTTPS for audio and video and UDP for content screen sharing.

The real-time media servers 212 then multiplex the various video and audio streams based on the target client device and communicate multiplexed streams to each client device. For example, the real-time media servers 212 receive audio and video streams from client devices 220-240 and only an audio stream from client device 250. The real-time media servers 212 then multiplex the streams received from devices 230-250 and provide the multiplexed streams to client device 220. The real-time media servers 212 are adaptive, for example, reacting to real-time network and client changes, in how they provide these streams. For example, the real-time media servers 212 may monitor parameters such as a client's bandwidth CPU usage, memory and network I/O as well as network parameters such as packet loss, latency and jitter to determine how to modify the way in which streams are provided.

The client device 220 receives the stream, performs any decryption, decoding, and demultiplexing on the received streams, and then outputs the audio and video using the client device's video and audio devices. In this example, the real-time media servers do not multiplex client device 220's own video and audio feeds when transmitting streams to it. Instead, each client device 220-250 only receives multimedia streams from other client devices 220-250. For telephony devices that lack video capabilities, e.g., client device 250, the real-time media servers 212 only deliver multiplex audio streams. The client device 220 may receive multiple streams for a particular communication, allowing the client device 220 to switch between streams to provide a higher quality of service.

In addition to multiplexing multimedia streams, the real-time media servers 212 may also decrypt incoming multimedia stream in some examples. As discussed above, multimedia streams may be encrypted between the client devices 220-250 and the video conference provider 210. In some such examples, the real-time media servers 212 may decrypt incoming multimedia streams, multiplex the multimedia streams appropriately for the various clients, and encrypt the multiplexed streams for transmission.

In some examples, to provide multiplexed streams, the video conference provider 210 may receive multimedia streams from the various participants and publish those streams to the various participants to subscribe to and receive. Thus, the video conference provider 210 notifies a client device, e.g., client device 220, about various multimedia streams available from the other client devices 230-250, and the client device 220 can select which multimedia stream(s) to subscribe to and receive. In some examples, the video conference provider 210 may provide to each client device the available streams from the other client devices, but from the respective client device itself, though in other examples it may provide all available streams to all available client devices. Using such a multiplexing technique, the video conference provider 210 may enable multiple different streams of varying quality, thereby allowing client devices to change streams in real-time as needed, e.g., based on network bandwidth, latency, etc.

As mentioned above with respect to FIG. 1, the video conference provider 210 may provide certain functionality with respect to unencrypted multimedia streams at a user's request. For example, the meeting host may be able to request that the meeting be recorded or that a transcript of the audio streams be prepared, which may then be performed by the real-time media servers 212 using the decrypted multimedia streams, or the recording or transcription functionality may be off-loaded to a dedicated server (or servers), e.g., cloud recording servers, for recording the audio and video streams. In some examples, the video conference provider 210 may allow a meeting participant to notify it of inappropriate behavior or content in a meeting. Such a notification may trigger the real-time media servers to 212 record a portion of the meeting for review by the video conference provider 210. Still other functionality may be implemented to take actions based on the decrypted multimedia streams at the video conference provider, such as monitoring video or audio quality, adjusting or changing media encoding mechanisms, etc.

It should be appreciated that multiple real-time media servers 212 may be involved in communicating data for a single meeting and multimedia streams may be routed through multiple different real-time media servers 212. In addition, the various real-time media servers 212 may not be co-located, but instead may be located at multiple different geographic locations, which may enable high-quality communications between clients that are dispersed over wide geographic areas, such as being located in different countries or on different continents. Further, in some examples, one or more of these servers may be co-located on a client's premises, e.g., at a business or other organization. For example, different geographic regions may each have one or more real-time media servers 212 to enable client devices in the same geographic region to have a high-quality connection into the video conference provider 210 via local servers 212 to send and receive multimedia streams, rather than connecting to a real-time media server located in a different country or on a different continent. The local real-time media servers 212 may then communicate with physically distant servers using high-speed network infrastructure, e.g., internet backbone network(s), that otherwise might not be directly available to client devices 220-250 themselves. Thus, routing multimedia streams may be distributed throughout the system of video conference provider 210 and across many different real-time media servers 212.

Turning to the network services servers 214, these servers 214 provide administrative functionality to enable client devices to create or participate in meetings, send meeting invitations, create or manage user accounts or subscriptions, and other related functionality. Further, these servers may be configured to perform different functionalities or to operate at different levels of a hierarchy, e.g., for specific regions or localities, to manage portions of the video conference provider under a supervisory set of servers. When a client device 220-250 accesses the video conference provider 210, it will typically communicate with one or more network services servers 214 to access their account or to participate in a meeting.

When a client device 220-250 first contacts the video conference provider 210 in this example, it is routed to a network services server 214. The client device may then provide access credentials for a user, e.g., a username and password or single sign-on credentials, to gain authenticated access to the video conference provider 210. This process may involve the network services servers 214 contacting a user identity provider 215 to verify the provided credentials. Once the user's credentials have been accepted, the client device may perform administrative functionality, like updating user account information, if the user has an identity with the video conference provider 210, or scheduling a new meeting, by interacting with the network services servers 214.

In some examples, users may access the video conference provider 210 anonymously. When communicating anonymously, a client device 220-250 may communicate with one or more network services servers 214 but only provide information to create or join a meeting, depending on what features the video conference provider allows for anonymous users. For example, an anonymous user may access the video conference provider using client 220 and provide a meeting ID and passcode. The network services server 214 may use the meeting ID to identify an upcoming or on-going meeting and verify the passcode is correct for the meeting ID. After doing so, the network services server(s) 214 may then communicate information to the client device 220 to enable the client device 220 to join the meeting and communicate with appropriate real-time media servers 212.

In cases where a user wishes to schedule a meeting, the user (anonymous or authenticated) may select an option to schedule a new meeting and may then select various meeting options, such as the date and time for the meeting, the duration for the meeting, a type of encryption to be used, one or more users to invite, privacy controls (e.g., not allowing anonymous users, preventing screen sharing, manually authorize admission to the meeting, etc.), meeting recording options, etc. The network services servers 214 may then create and store a meeting record for the scheduled meeting. When the scheduled meeting time arrives (or within a threshold period of time in advance), the network services server(s) 214 may accept requests to join the meeting from various users.

To handle requests to join a meeting, the network services server(s) 214 may receive meeting information, such as a meeting ID and passcode, from one or more client devices 220-250. The network services server(s) 214 locate a meeting record corresponding to the provided meeting ID and then confirm whether the scheduled start time for the meeting has arrived, whether the meeting host has started the meeting, and whether the passcode matches the passcode in the meeting record. If the request is made by the host, the network services server(s) 214 activates the meeting and connects the host to a real-time media server 212 to enable the host to begin sending and receiving multimedia streams.

Once the host has started the meeting, subsequent users requesting access will be admitted to the meeting if the meeting record is located and the passcode matches the passcode supplied by the requesting client device 220-250. In some examples additional access controls may be used as well. But if the network services server(s) 214 determines to admit the requesting client device 220-250 to the meeting, the network services server 214 identifies a real-time media server 212 to handle multimedia streams to and from the requesting client device 220-250 and provides information to the client device 220-250 to connect to the identified real-time media server 212. Additional client devices 220-250 may be added to the meeting as they request access through the network services server(s) 214.

After joining a meeting, client devices will send and receive multimedia streams via the real-time media servers 212, but they may also communicate with the network services servers 214 as needed during meetings. For example, if the meeting host leaves the meeting, the network services server(s) 214 may appoint another user as the new meeting host and assign host administrative privileges to that user. Hosts may have administrative privileges to allow them to manage their meetings, such as by enabling or disabling screen sharing, muting or removing users from the meeting, creating sub-meetings or "break-out" rooms, recording meetings, etc. Such functionality may be managed by the network services server(s) 214.

For example, if a host wishes to remove a user from a meeting, they may identify the user and issue a command through a user interface on their client device. The command may be sent to a network services server 214, which may then disconnect the identified user from the corresponding real-time media server 212. If the host wishes to create a break-out room for one or more meeting participants to join, such a command may also be handled by a network services server 214, which may create a new meeting record corresponding to the break-out room and then connect one or more meeting participants to the break-out room similarly to how it originally admitted the participants to the meeting itself.

In addition to creating and administering on-going meetings, the network services server(s) 214 may also be responsible for closing and tearing-down meetings once they have completed. For example, the meeting host may issue a command to end an on-going meeting, which is sent to a network services server 214. The network services server 214 may then remove any remaining participants from the meeting, communicate with one or more real time media servers 212 to stop streaming audio and video for the meeting, and deactivate, e.g., by deleting a corresponding passcode for the meeting from the meeting record, or delete the meeting record(s) corresponding to the meeting. Thus, if a user later attempts to access the meeting, the network services server(s) 214 may deny the request.

Depending on the functionality provided by the video conference provider, the network services server(s) 214 may provide additional functionality, such as by providing private meeting capabilities for organizations, special types of meetings (e.g., webinars), etc. Such functionality may be provided according to various examples of video conferencing providers according to this description.

Referring now to the video room gateway servers 216, these servers 216 provide an interface between dedicated video conferencing hardware, such as may be used in dedicated video conferencing rooms. Such video conferencing hardware may include one or more cameras and microphones and a computing device designed to receive video and audio streams from each of the cameras and microphones and connect with the video conference provider 210. For example, the video conferencing hardware may be provided by the video conference provider to one or more of its subscribers, which may provide access credentials to the video conferencing hardware to use to connect to the video conference provider 210.

The video room gateway servers 216 provide specialized authentication and communication with the dedicated video conferencing hardware that may not be available to other client devices 220-230, 250. For example, the video conferencing hardware may register with the video conference provider 210 when it is first installed and the video room gateway servers 216 may authenticate the video conferencing hardware using such registration as well as information provided to the video room gateway server(s) 216 when dedicated video conferencing hardware connects to it, such as device ID information, subscriber information, hardware capabilities, hardware version information etc. Upon receiving such information and authenticating the dedicated video conferencing hardware, the video room gateway server(s) 216 may interact with the network services servers 214 and real-time media servers 212 to allow the video conferencing hardware to create or join meetings hosted by the video conference provider 210.

Referring now to the telephony gateway servers 218, these servers 218 enable and facilitate telephony devices' participation in meetings hosed by the video conference provider 210. Because telephony devices communicate using the PSTN and not using computer networking protocols, such as TCP/IP, the telephony gateway servers 218 act as an interface that converts between the PSTN and the networking system used by the video conference provider 210.

For example, if a user uses a telephony device to connect to a meeting, they may dial a phone number corresponding to one of the video conference provider's telephony gateway servers 218. The telephony gateway server 218 will answer the call and generate audio messages requesting information from the user, such as a meeting ID and passcode. The user may enter such information using buttons on the telephony device, e.g., by sending dual-tone multi-frequency ("DTMF") audio signals to the telephony gateway server 218. The telephony gateway server 218 determines the numbers or letters entered by the user and provides the meeting ID and passcode information to the network services servers 214, along with a request to join or start the meeting, generally as described above. Once the telephony client device 250 has been accepted into a meeting, the telephony gateway server 218 is instead joined to the meeting on the telephony device's behalf.

After joining the meeting, the telephony gateway server 218 receives an audio stream from the telephony device and provides it to the corresponding real-time media server 212 and receives audio streams from the real-time media server 212, decodes them, and provides the decoded audio to the telephony device. Thus, the telephony gateway servers 218 operate essentially as client devices, while the telephony device operates largely as an input/output device, e.g., a microphone and speaker, for the corresponding telephony gateway server 218, thereby enabling the user of the telephony device to participate in the meeting despite not using a computing device or video.

It should be appreciated that the components of the video conference provider 210 discussed above are merely examples of such devices and an example architecture. Some video conference providers may provide more or less functionality than described above and may not separate functionality into different types of servers as discussed above. Instead, any suitable servers and network architectures may be used according to different examples.

Figure 3:
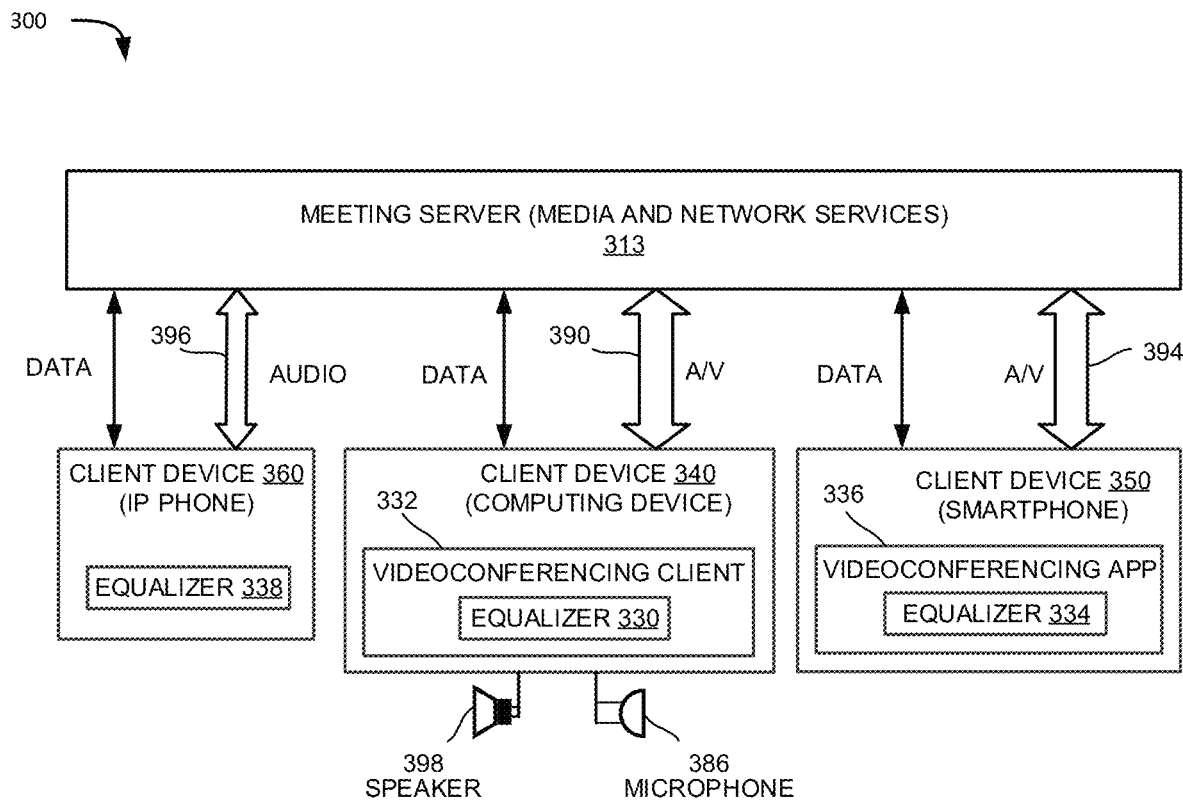

Referring to FIG. 3, FIG. 3 shows example system 300. Example system 300 includes meeting server 313. Meeting server 313 may also be referred to as a multimedia router and can be implemented by the real-time media servers 212 working with the network services servers 214. The meeting server can keep track of the status of meetings without constantly exchanging this information with client devices.

System 300 includes an equalizer module 330 maintained on client device 340, which is coupled to meeting server 313 during a videoconferencing meeting. The equalizer module 330 is part of a videoconferencing client application 332 installed on client device 340, which in this example is a computing device such as a desktop or notebook computer. An equalizer module 334 is installed in client device 350, which in this example is a smartphone, but can be any suitable client device. Equalizer module 334 is part of a videoconferencing app 336. Equalizer module 338 is installed in client device 360, which in this example is an internet protocol (IP) telephone, but can be any suitable client device.

The various hardware configurations in use in a system such as system 300 may result in input audio signals for the equalizer having widely varying sampling rates. For example, dedicated telephony device such as IP telephone 360 may use an audio sampling rate of 8 kHz. Other devices may use higher sampling rates, such as 16 kHz, 32 kHz, or even 48 kHz, which may be used in audiovisual presentations such as movies and television shows. The same audio processing can be used in different kinds of client devices, wherein a first audio signal of the various input audio signals includes a telephone audio signal having an 8 kHz sampling rate and a second audio signal of the audio signals is from a mobile device audio signal having a higher sampling rate than that of the telephone audio signal. It is also possible to have multiple audio streams processed by the same client device where each has a different respective sampling rate. For example, one audio stream may be associated with a microphone, and another may be associated with an CODEC internal to the client device that is used for audio or video content. Equalization may be applied to a subset of possible audio input signals based on sampling rate.

In system 300, client devices maintain an active data connection for any video or audio conference in which the host client device is participating. These data connections are illustrated with the single width, two-headed arrows in FIG. 3. The data connections are used for control, presence indication, chat, and other similar functions and can be maintained using TCP. Additionally, audio/video (A/V) streams carry video and audio between the meeting server 313 and the client devices that are video capable. A/V stream 390 provides audio and video exchange between client device 340 and meeting server 313. A/V stream 394 provides audio and video exchange between client device 350 and meeting server 313. A/V streams, including the digital audio frames that make up the audio portion of the streams, can be provided using UDP. Telephone client device 360 in this example has no video capability. Audio stream 396, during an online conference, provides audio exchange between client device 360 and meeting server 313. Digital audio signal frames forming the audio stream 396 can be provided using UDP. A digital audio signal frame is a data record containing samples for the channels of digital audio represented over a certain period of time.

The equalizer modules in system 300 can accept sound originating from a sound input or microphone associated with or connected to the respective client device. For purposes of this example, client devices 350 and 360 have built-in microphones (and speakers), while client device 340 has an externally connected microphone 386. Client device 340 also includes an externally connected speaker 398. Either or both of these sound elements may be part of a webcam, sound bar, or headset. Alternatively, the microphone 386 may be separate from the speaker 398, for example, a desk or boom microphone, or a microphone that is part of a webcam. Sounds such as speech received via microphone 386 may be digitized for processing. A digital stream including those sounds is delivered to meeting server 313 as part of the A/V stream 390 after equalization, and possible after additional audio processing as discussed below with respect to FIG. 4.

Figure 4:
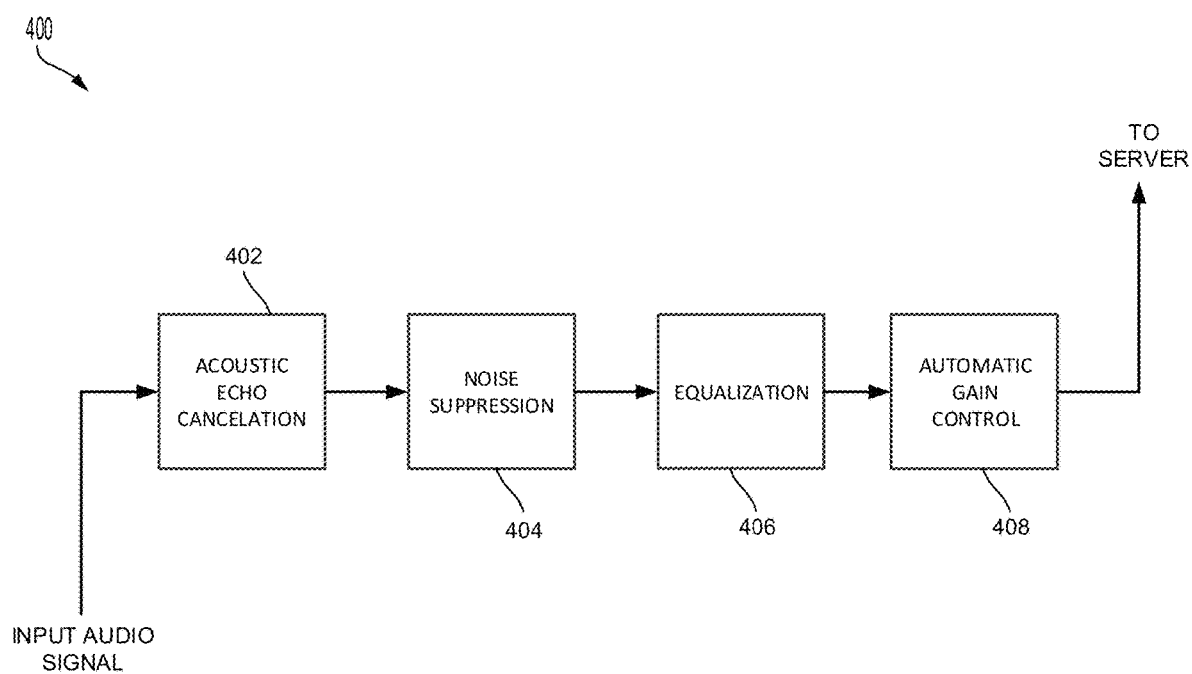
FIG. 4 illustrates a block diagram of an example of a signal processing flow for the automatic audio equalization as described herein.

Referring now to the FIG. 4, FIG. 4 is a block diagram illustrating an example of a signal processing flow 400 using the automatic audio equalization as described herein. In this example, an acoustic echo cancelation module 402 receives audio originating from a microphone such as microphone 386. The analog signal from the microphone may be converted to a digital signal using an analog-to-digital converter so that the audio processing can be handled in the digital domain using digital signal processing hardware within the client device. The digital signal processing hardware may be built-in to a general-purpose microprocessor or may be in a digital signal processor, depending on the specific client device.

The signal from the acoustic echo cancelation module 402 in FIG. 4 is processed by a noise suppression module 404. The equalization module ("equalizer") 406 determines the audio spectrum of each frame or group of frames of the input audio signal as well as the respective energy values determined frequency bands. Per-band equalization can then be selectively applied to the audio signal to adjust the energy value for each frequency band to produce an output audio signal. The term "input audio signal" as used herein refers to the audio signal being received by a particular module being discussed. The equalizer 406 can be used as a standalone signal processing module, in which case the input audio signal may be the digital signal corresponding to the audio output from the microphone.

Processing such as echo cancelation and noise suppression, while effective for handling echoes and noise, can lower the sound quality of spoken audio, as can the built-in audio processing, sensitivity of microphones, and meeting room acoustical designs. The automatic equalization described herein may be used to restore the audio quality to the sound being provided to an online conferencing system in the face of such earlier audio processing stages and effects.

Still referring to FIG. 4, automatic gain control (AGC) module 408 adjusts the overall magnitude of the signal, with substantially all spectral components as sent to a server such as meeting server 313. If the input audio signal for the AGC module is digital, AGC is provided by a signal processing algorithm, which calculates amplitude values for the stage's output signal with respect to a reference value and adjust amplitude values accordingly. Such a process replicates an analog AGC process that would rely on a variable-gain amplifier and a detector.

Figure 5:
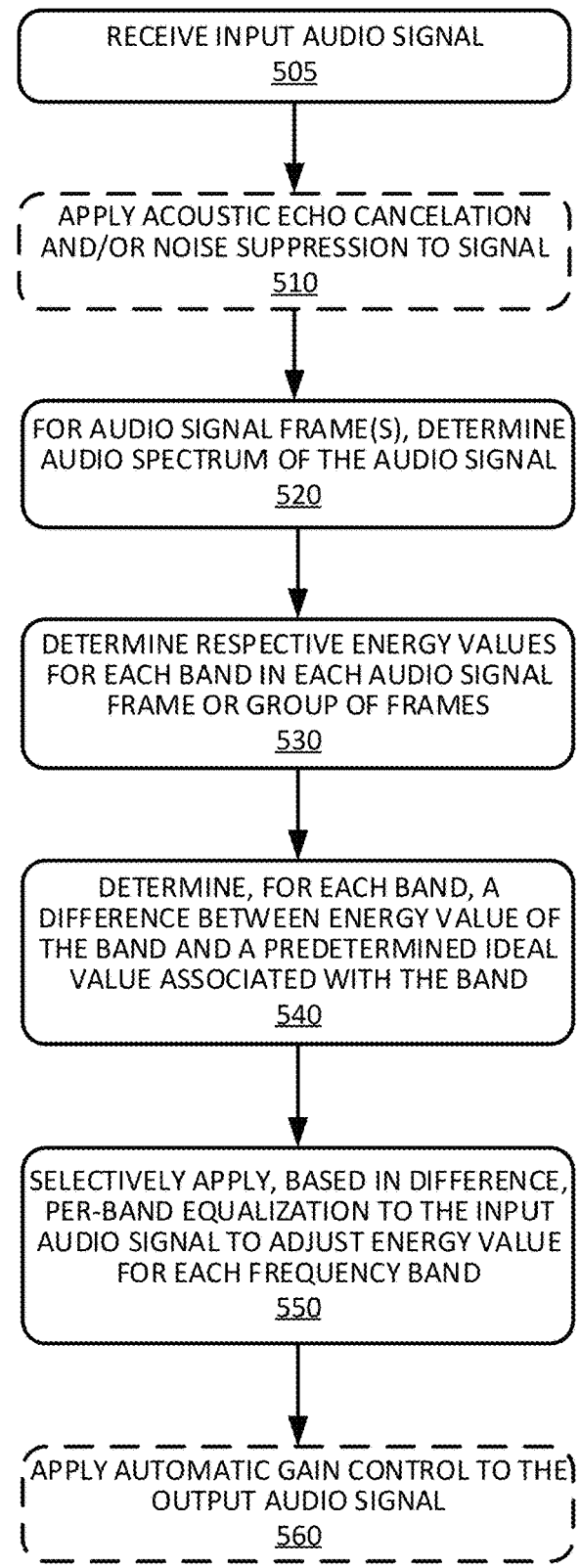
FIG. 5 illustrates an example method for providing videoconferencing with automatic audio equalization as described herein.

Referring now to the method illustrated in FIG. 5, FIG. 5 shows an example method 500 for providing automatic audio equalization. The description of the method 500 in FIG. 5 will be made with reference to signal processing flow of FIG. 4. The description will also make reference to the system of FIG. 3. However, any suitable system according to this disclosure may be used, such as the example systems 100 and 200 shown in FIGS. 1 and 2.

At block 505, a processor or processors, for example, a processor such as processor 810 (discussed below with respect to FIG. 8) running in on or more client devices 340-360, receives an input audio signal. At block 510, one or more of acoustic echo cancellation by module 402 or noise suppression by module 404 is optionally applied to the input audio signal. At block 520, for each audio signal frame or group of frames, the processing device determines the audio spectrum of the audio signal. As an example, an audio frame length may be from 5 seconds to 15 seconds.

If shorter frames are being used, the process described herein may be applied to several frames at a time. If longer frames are being used, the process may be applied on a frame-by-frame basis. The audio spectrum may be divided into, as an example, 10 to 30 frequency bands. The frequency range used may on the sampling rate of the audio stream. As an example, for voice transmission with a 16 kHz sampling rate, a frequency range of 0 to 8 kHz may be used, and a smaller number of frequency bands may be used. Alternatively, as an example, a 24 kHz upper frequency limit can be used if high-quality audio is desired, for example, for musical or theatrical performances sampled at 48 kHz that may be delivered via an online conferencing system. More frequency bands may be used if a larger range of frequencies is being processed.

Still referring to FIG. 5, at block 530, the processing device determines respective energy values for each band in each audio signal frame or group of frames. At block 540, the processing device determines, for each band under consideration, a difference between the energy value of the band in the audio frame(s) as received and a predetermined ideal value associated with the band. At block 550, the processing device selectively applies, based on the differences, per band equalization to the input audio signal to adjust the energy value for each frequency band.

Adjustments are selectively applied if needed based on the difference being within or outside an acceptable range. Further details of this process are described below with respect to FIG. 6. At block 560, automatic gain control can optionally be applied to the output audio signal, for example, by AGC module 408.

Figure 6:
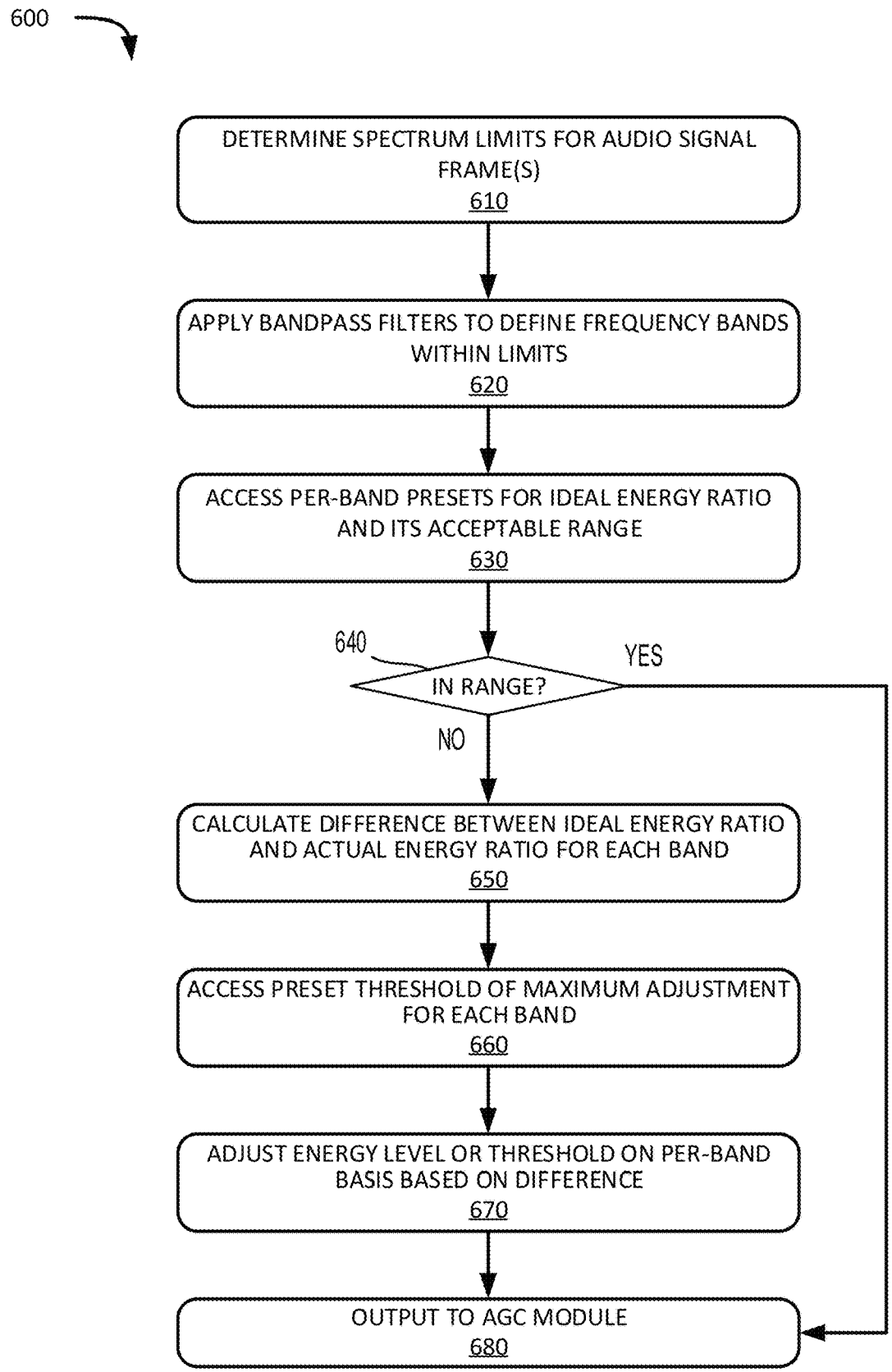
FIG. 6 illustrates an example method for providing automatic audio equalization as described herein.

Referring now to the method illustrated in FIG. 6, FIG. 6 shows an example method 600 for providing automatic audio equalization. The description of the method 600 in FIG. 6 will be made with reference signal processing flow of FIG. 4. The description will also make reference to the system of FIG. 3. However, any suitable system according to this disclosure may be used, such as the example systems 100 and 200 shown in FIGS. 1 and 2.

In order to provide automatic audio equalization, processor or processors, for example, a processor such as processor 810 (discussed below with respect to FIG. 8) running in on or more client devices 340-360 determines the audio spectrum of interest. The processor determines the limits of the spectrum to be considered at block 610 and, at block 620, applies bandpass filters to define frequency bands within the spectrum of interest. These determinations may be made on a frame-by-frame basis or for several frames at a time, depending on the size of the digital audio frames being used in the system. As previously discussed, for voice use, a spectrum of 0 to 8 kHz can be used. Certain conferencing systems may have settings that enable more faithful reproduction of music or theatrical audiovisual presentations, in which case any broader spectrum of frequencies may be used.

At block 630 of method 600, the processing device accesses per band presets for an ideal energy value and the acceptable range of the energy value. In this example, the energy values are ratios. The energy ratio is defined as the energy within a given band as compared to the energy of the entire spectrum of interest. A ratio is used because the energy level of the entire audio spectrum, corresponding to the audio volume, can vary greatly. This variation can be handled by the AGC module. Adjusting the absolute energy level of individual frequency bands would produce a spectral response that varies in relative shape and sound with overall spectral energy.

At block 640, the processing device determines whether the energy ratio is within range for each band being considered. If the energy ratios are already in range, processing proceeds to block 680, where the equalizer outputs to an AGC module, for example, AGC module 408. Skipping equalization altogether based on ranges of ratios will likely result in a frequency response that does not match the ideal frequency response precisely. However, matching the target frequency response precisely is not necessary. Slight variations in the audio frequency spectrum may be undetectable to a listener and may not affect intelligibility of the audio produced from the digital audio stream. An equalized frequency response and an ideal frequency response are compared and discussed below with respect to FIG. 7.

Still referring to FIG. 6, at block 650, the processing device calculates the difference between the ideal energy ratio and the actual energy ratio for each band under consideration. At block 660, the processing device accesses a preset threshold (preset maximum energy adjustment) for each band. At block 670, the energy level is adjusted, or the threshold is changed for the next frame(s), based on the difference between the amount of adjustment required to bring the ratio within range and the preset threshold for energy adjustment. The maximum adjustment threshold is configured to smooth sharp changes in perceived audio By adjusting either the energy level output for a band or the threshold to be used in the next frame(s), equalization effects are smoothed over time and abrupt changes are avoided. This technique can be described by the expression:

If |diff|≥th, then adjust th; if |diff|≤th, then adjust level, where diff is the difference between the preset ideal energy ratio and the measured energy ratio and th is the current threshold for maximum adjustment. In one example, the initial adjustment limit is set to 3 dB, 4 dB or 5 dB, and if needed, the adjustment threshold is increased in 1 dB increments.

At block 680, the equalizer outputs the equalized signal to AGC module 408. The method 600 repeats for each frame or group of frames in the digital audio stream, as indicated by the return to block 610 shown in FIG. 6.

The ideal energy ratio(s) can be determined in advance for a particular conferencing system by sampling a variety of audio inputs that are consistent with what would be expected in a particular system. For example, a variety of clean, high-quality speech sequences can be collected, and statistics can be gathered to find average frequency responses. A library of settings can even be built over time for different settings or environments that might be encountered for particular types of audio or different kinds of hardware. Machine-learning techniques can also be employed to produce a target response.

Figure 7:
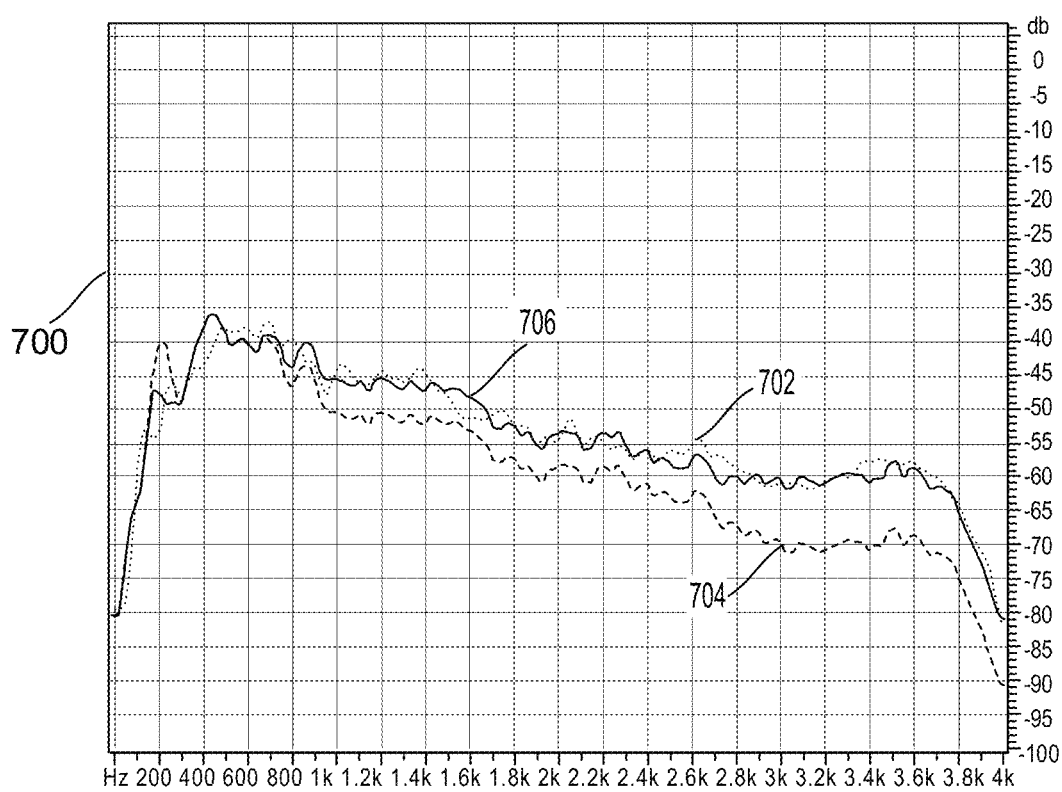
FIG. 7 shows a frequency response diagram that illustrates an example of the automatic audio equalization described herein.

Referring now to FIG. 7, FIG. 7 shows a frequency response diagram 700 that illustrates an example of the automatic audio equalization described herein. The diagram 700 includes frequency values on the horizontal axis and gain values on the vertical axis. Dotted curve 702 represents the target frequency response for audio being transmitted to the server, for example, meeting server 313. The target frequency response is determined in advance based on how signals are processed by the server and other entities as well as human factors considerations and knowledge of the processing of received audio streams that may be carried out by client applications such as those in the client devices shown in FIG. 3.

Dashed curve 704 in FIG. 7 represents the input audio signal, in this case the input audio signal from a microphone such as microphone 386, minus any detected echoes and noise, both of which can be removed by stages of processing prior to equalization, such as by echo cancellation module 402 and noise suppression module 404. Note that the frequency response of the input audio signal deviates from the target frequency response, especially at higher audio frequencies. The solid curve 706 represents the frequency response after applying the automatic audio equalization as described herein. Matching the target frequency response exactly is not necessary. Slight variations are undetectable and do not affect intelligibility of the audio produced from the digital audio stream.

Figure 8:
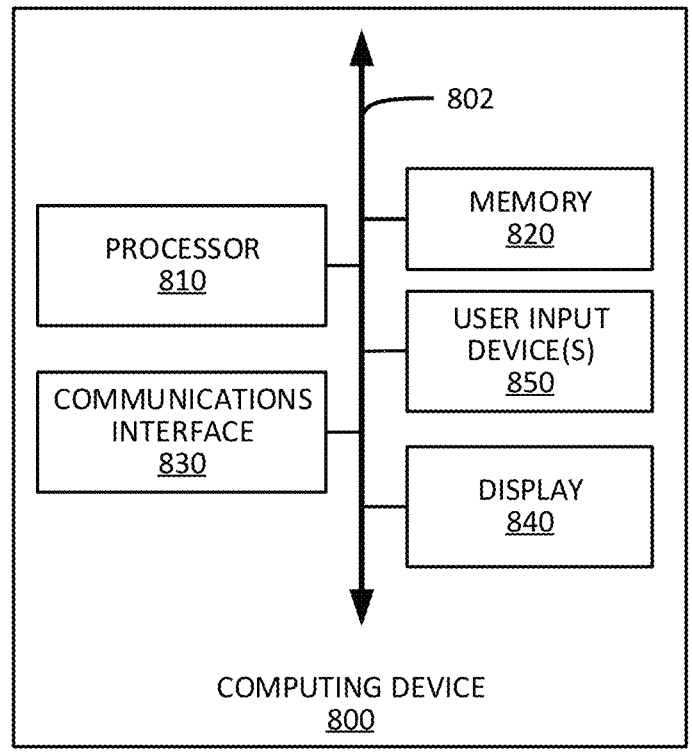
FIG. 8 shows an example computing device suitable for use with any disclosed systems or methods according to this disclosure.

Referring now to FIG. 8, FIG. 8 shows an example computing device 800 suitable for use in example systems or methods for providing automatic audio equalization. The example computing device 800 includes a processor 810 which is in communication with the memory 820 and other components of the computing device 800 using one or more communications buses 802. The processor 810 is configured to execute processor-executable instructions stored in the memory 820 to perform one or more methods for providing automatic audio equalization. The computing device, in this example, also includes one or more user input devices 850, such as a keyboard, mouse, touchscreen, video input device (e.g., one or more cameras), microphone, etc., to accept user input, for example user input directed to activating or interacting with a videoconferencing application such as videoconferencing client device 340 or videoconferencing app 336. The computing device 800 also includes a display 840 to provide visual output to a user.

The computing device 800 also includes a communications interface 830. In some examples, the communications interface 830 may enable communications using one or more networks, including a local area network ("LAN"); wide area network ("WAN"), such as the Internet; metropolitan area network ("MAN"); point-to-point or peer-to-peer connection; etc. Communication with other devices may be accomplished using any suitable networking protocol. For example, one suitable networking protocol may include the Internet Protocol ("IP"), Transmission Control Protocol ("TCP"), User Datagram Protocol ("UDP"), or combinations thereof, such as TCP/IP or UDP/IP.

As used below, any reference to a series of examples is to be understood as a reference to each of those examples disjunctively (e.g., "Examples 1-4" is to be understood as "Examples 1, 2, 3, or 4").

Example number 1 is a method including receiving an input audio signal at a client device, determining an audio spectrum of an audio signal frame of the input audio signal, determining a respective energy value for each frequency band of multiple frequency bands in the audio signal frame, determining, for each frequency band of the frequency bands, a difference between the respective energy value of the respective frequency band and a predetermined ideal band value associated with the respective frequency band; and selectively applying, based on the differences, per-band equalization to the input audio signal to adjust the respective energy value for each frequency band of the frequency bands to produce an output audio signal.

Example number 2 is the method of example(s) 1, further including receiving input audio signals at the client device, and selectively applying the per-band equalization to a subset of the input audio signals, each input audio signal having a respective sampling rate.

Example number 3 us the method of example(s) 1-2, wherein selectively applying the per-band equalization comprises selectively applying the per-band equalization subject to a maximum adjustment threshold to smooth sharp changes in perceived audio.

Example number 4 is the method of example(s) 1-3, further including applying bandpass filters over the audio signal frame to produce the frequency bands.

Example number 5 is the method of example(s) 1-4, further including applying acoustic echo cancelation to the input audio signal and applying noise suppression to the input audio signal.

Example number 6 is the method of example(s) 1-5, further including applying automatic gain control to the output audio signal.

Example number 7 is the method of example(s) 1-6, wherein the client device includes a computing device configured to execute a videoconferencing application, the computing device including or connected to a microphone configured to produce the input audio signal.

Example number 8 is system including a processor and at least one memory device including instructions that are executable by the processor to cause the processor to execute the method of any of examples 1-7.

Example number 9 is a non-transitory computer-readable medium including code that is executable by a processor for causing the processor to carry out the method of any of examples 1-7.

While some examples of methods and systems herein are described in terms of software executing on various machines, the methods and systems may also be implemented as specifically configured hardware, such as field-programmable gate array (FPGA) specifically to execute the various methods according to this disclosure. For example, examples can be implemented in digital electronic circuitry, or in computer hardware, firmware, software, or in a combination thereof. In one example, a device may include a processor or processors. The processor comprises a computer-readable medium, such as a random-access memory (RAM) coupled to the processor. The processor executes computer-executable program instructions stored in at least one memory device, such as executing one or more computer programs. Such processors may comprise a microprocessor, a digital signal processor (DSP), an application-specific integrated circuit (ASIC), field programmable gate arrays (FPGAs), and state machines. Such processors may further comprise programmable electronic devices such as PLCs, programmable interrupt controllers (PICs), programmable logic devices (PLDs), programmable read-only memories (PROMs), electronically programmable read-only memories (EPROMs or EEPROMs), or other similar devices.

Such processors may comprise, or may be in communication with, media, for example one or more non-transitory computer-readable media, which may store processor-executable instructions that, when executed by the processor, can cause the processor to perform methods according to this disclosure as carried out, or assisted, by a processor. Examples of non-transitory computer-readable medium may include, but are not limited to, an electronic, optical, magnetic, or other storage device capable of providing a processor, such as the processor in a web server, with processor-executable instructions. Other examples of non-transitory computer-readable media include, but are not limited to, a floppy disk, CD-ROM, magnetic disk, memory chip, ROM, RAM, ASIC, configured processor, all optical media, all magnetic tape or other magnetic media, or any other medium from which a computer processor can read. The processor, and the processing, described may be in one or more structures, and may be dispersed through one or more structures. The processor may comprise code to carry out methods (or parts of methods) according to this disclosure.

The foregoing description of some examples has been presented only for the purpose of illustration and description and is not intended to be exhaustive or to limit the disclosure to the precise forms disclosed. Numerous modifications and adaptations thereof will be apparent to those skilled in the art without departing from the spirit and scope of the disclosure.

Reference herein to an example or implementation means that a particular feature, structure, operation, or other characteristic described in connection with the example may be included in at least one implementation of the disclosure. The disclosure is not restricted to the particular examples or implementations described as such. The appearance of the phrases "in one example," "in an example," "in one implementation," or "in an implementation," or variations of the same in various places in the specification does not necessarily refer to the same example or implementation. Any particular feature, structure, operation, or other characteristic described in this specification in relation to one example or implementation may be combined with other features, structures, operations, or other characteristics described in respect of any other example or implementation.

Use herein of the word "or" is intended to cover inclusive and exclusive OR conditions. In other words, A or B or C includes any or all of the following alternative combinations as appropriate for a particular usage: A alone; B alone; C alone; A and B only; A and C only; B and C only; and A and B and C.

That which is claimed is:

1. A method comprising:
receiving an input audio signal at a client device;
determining an audio spectrum of an audio signal frame of the input audio signal;
determining a respective energy value for each frequency band of a plurality of frequency bands in the audio signal frame;
determining, for each frequency band of the plurality of frequency bands, a difference between the respective energy value of the respective frequency band and a predetermined ideal band value associated with the respective frequency band, wherein the respective energy value is a ratio of energy within a given band to an entire energy of the plurality of frequency bands; and
selectively applying, in real time, based on the differences, per-band equalization to the input audio signal to adjust the respective energy value for each frequency band of the plurality of frequency bands to produce an output audio signal.

2. The method of claim 1, further comprising receiving a plurality of input audio signals at the client device, and selectively applying the per-band equalization to a subset of the plurality of input audio signals, each input audio signal having a respective sampling rate.

3. The method of claim 1, wherein selectively applying the per-band equalization comprises selectively applying the per-band equalization subject to a maximum adjustment threshold to smooth sharp changes in perceived audio.

4. The method of claim 1, further comprising applying a plurality of bandpass filters over the audio signal frame to produce the plurality of frequency bands.

5. The method of claim 1, further comprising:
applying acoustic echo cancelation to the input audio signal; and
applying noise suppression to the input audio signal.

6. The method of claim 1, further comprising applying automatic gain control to the output audio signal.

7. The method of claim 1, wherein the client device comprises a computing device configured to execute a videoconferencing application, the method further comprising transmitting the output audio signal in real time using an audio and video data server communicatively coupled to the videoconferencing application.

8. A system comprising:
a processor; and
at least one memory device including instructions that are executable by the processor to cause the processor to:
receive an input audio signal at a client device;
determine an audio spectrum of an audio signal frame of the input audio signal;
determine a respective energy value for each frequency band of a plurality of frequency bands in the audio signal frame;
determine, for each frequency band of the plurality of frequency bands, a difference between the respective energy value of the respective frequency band and a predetermined ideal band value associated with the respective frequency band, wherein the respective energy value is a ratio of energy within a given band to an entire energy of the plurality of frequency bands; and
selectively apply, in real time, based on the differences, per-band equalization to the input audio signal to adjust the respective energy value for each frequency band of the plurality of frequency bands to produce an output audio signal.

9. The system of claim 8, wherein the instructions further cause the processor to receive a plurality of input audio signals at the client device, and selectively apply the per-band equalization to a subset of the plurality of input audio signals, each input audio signal having a respective sampling rate.

10. The system of claim 8, wherein the per-band equalization is subject to a maximum adjustment threshold configured to smooth sharp changes in perceived audio.

11. The system of claim 8, wherein the instructions further cause the processor to apply a plurality of bandpass filters over the audio signal frame to produce the plurality of frequency bands.

12. The system of claim 8, wherein the instructions further cause the processor to:
apply acoustic echo cancelation to the input audio signal; and
apply noise suppression to the input audio signal.

13. The system of claim 8, wherein the instructions further cause the processor to apply automatic gain control to the output audio signal.

14. The system of claim 8, wherein the client device comprises a computing device configured to execute a videoconferencing application, wherein the instructions further cause the processor to transmit the output audio signal in real time using an audio and video data server communicatively coupled to the videoconferencing application.

15. A non-transitory computer-readable medium comprising code that is executable by a processor for causing the processor to:
receive an input audio signal at a client device;
determine an audio spectrum of an audio signal frame of the input audio signal;
determine a respective energy value for each frequency band of a plurality of frequency bands in the audio signal frame;
determine, for each frequency band of the plurality of frequency bands, a difference between the respective energy value of the respective frequency band and a predetermined ideal band value associated with the respective frequency band, wherein the respective energy value is a ratio of energy within a given band to an entire energy of the plurality of frequency bands; and selectively apply, in real time, based on the differences, per-band equalization to the input audio signal to adjust the respective energy value for each frequency band of the plurality of frequency bands to produce an output audio signal.

16. The non-transitory computer-readable medium of claim 15, wherein the code is executable for causing the processor to receive a plurality of input audio signals at the client device, and selectively apply the per-band equalization to a subset of the plurality of input audio signals, each input audio signal having a respective sampling rate.

17. The non-transitory computer-readable medium of claim 16, wherein the per-band equalization is subject to a maximum adjustment threshold configured to smooth sharp changes in perceived audio.

18. The non-transitory computer-readable medium of claim 15, wherein the code is executable for causing the processor to apply a plurality of bandpass filters over the audio signal frame to produce the plurality of frequency bands.

19. The non-transitory computer-readable medium of claim 15, wherein the code is executable for causing the processor to:
apply acoustic echo cancelation to the input audio signal;
apply noise suppression to the input audio signal; and
apply automatic gain control to the output audio signal.

20. The non-transitory computer-readable medium of claim 15, wherein the client device comprises a computing device configured to execute a videoconferencing application, wherein the code is executable for causing the processor to transmit the output audio signal in real time using an audio and video data server communicatively coupled to the videoconferencing application.

* * * * *